(12) United States Patent
Kuroki

(10) Patent No.: US 6,201,743 B1
(45) Date of Patent: *Mar. 13, 2001

(54) SEMICONDUCTOR DEVICE HAVING DELAY CIRCUIT FOR RECEIVING READ INSTRUCTION SIGNAL

(75) Inventor: Masaaki Kuroki, Miyazaki (JP)

(73) Assignee: Oki Electric Industry Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/043,151

(22) PCT Filed: Jul. 24, 1997

(86) PCT No.: PCT/JP97/02564

§ 371 Date: Mar. 13, 1998

§ 102(e) Date: Mar. 13, 1998

(87) PCT Pub. No.: WO98/05036

PCT Pub. Date: Feb. 5, 1998

(30) Foreign Application Priority Data

Jul. 26, 1996 (JP) .................................................. 8-197150

(51) Int. Cl.[7] .............................. G11C 7/00; H03K 19/00
(52) U.S. Cl. ........................ 365/194; 365/189.05; 326/27; 326/58; 326/86
(58) Field of Search ............................. 365/189.05, 194, 365/191, 193; 326/81, 86, 21, 57, 58, 26, 27

(56) References Cited

U.S. PATENT DOCUMENTS

| 4,337,523 | 6/1982 | Hotta et al. | 365/194 |
| 4,661,928 | 4/1987 | Yasuoka | 365/189 |
| 5,384,735 | * 1/1995 | Park et al. | 365/189.05 |
| 5,436,865 | 7/1995 | Kitazawa | 365/194 |
| 5,488,581 | * 1/1996 | Nagao et al. | 365/189.05 |
| 5,532,961 | * 7/1996 | Mori et al. | 365/189.05 |
| 5,585,744 | * 12/1996 | Runas et al. | 326/86 |
| 5,617,362 | 4/1997 | Mori et al. | 365/189.05 |
| 5,818,767 | * 10/1998 | Kim et al. | 365/191 |

FOREIGN PATENT DOCUMENTS

| 44 43 967 | 6/1995 | (DE) . |
| 4-214290 | 8/1992 | (JP) . |
| 5-74174 | 3/1993 | (JP) . |
| 63-53513 | 3/1998 | (JP) . |

* cited by examiner

Primary Examiner—Son Mai
(74) Attorney, Agent, or Firm—Jones Volentine, LLC

(57) ABSTRACT

The invention typically relates to a semiconductor device comprising a driving portion composed of an output transistor NMOS 130 or PMOS 129 for driving an output terminal, and a control portion for controlling the operation state of the driving portion. The control portion outputs an enable signal for turning on or off the output transistor NMOS 130 or PMOS 129. The enable signal is produced by a pulse-shaped read instruction signal IN1 for increasing the time involved in the change from on to off of the output transistor NMOS 130 or PMOS 129.

19 Claims, 14 Drawing Sheets

FIG.8
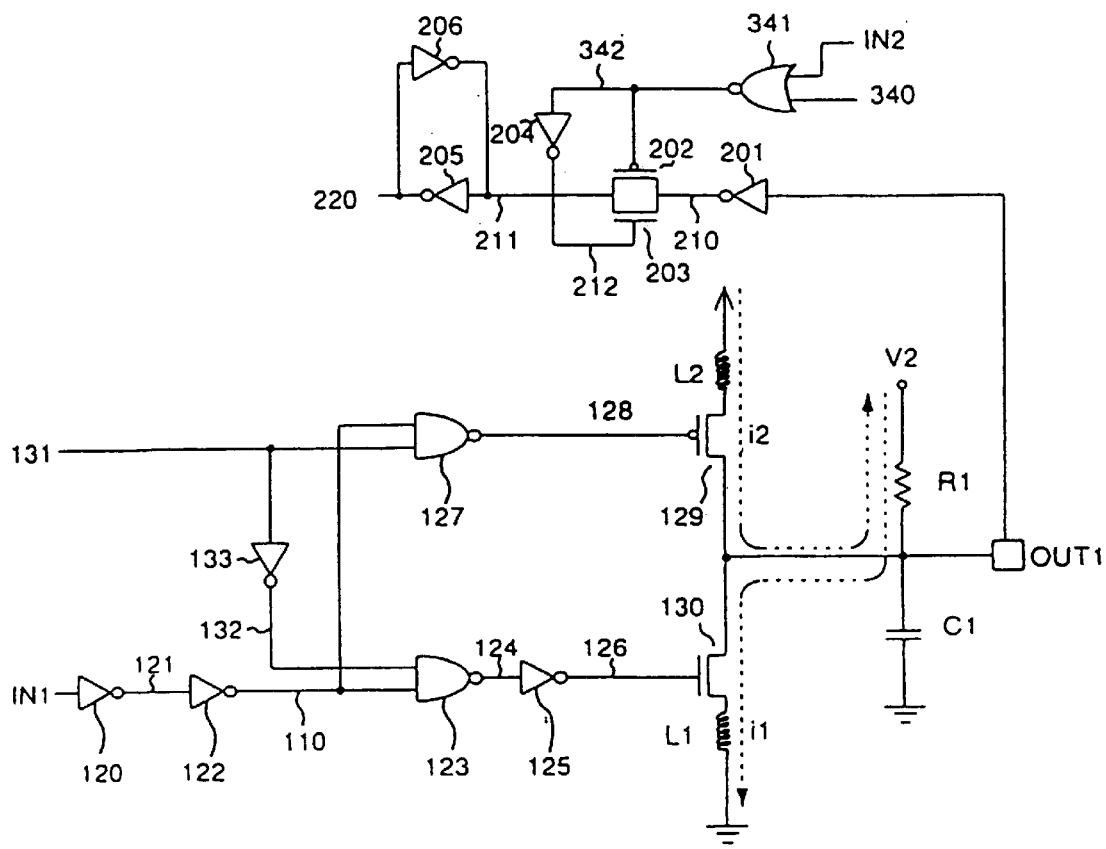
(a)
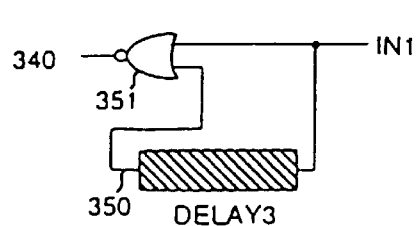
(b)
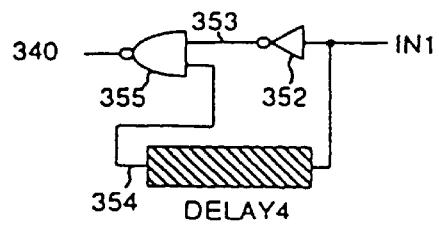
(c)

FIG.13
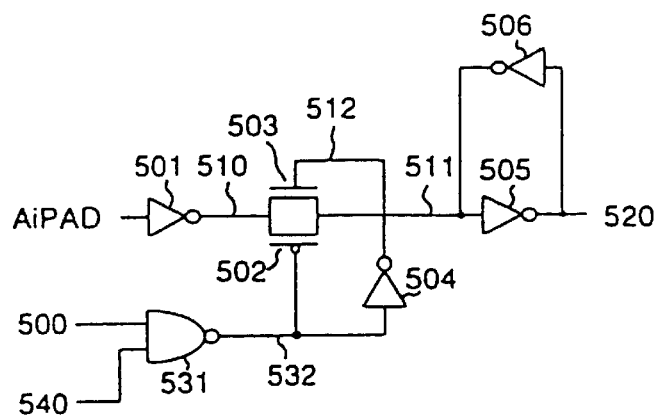
(a)
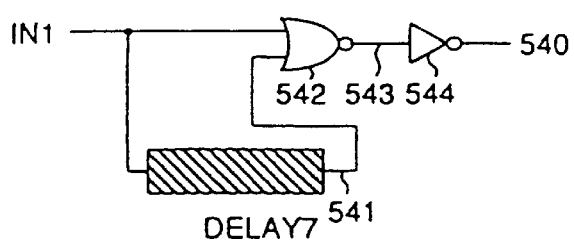
(b)
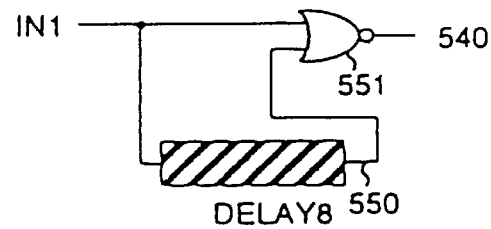
(c)

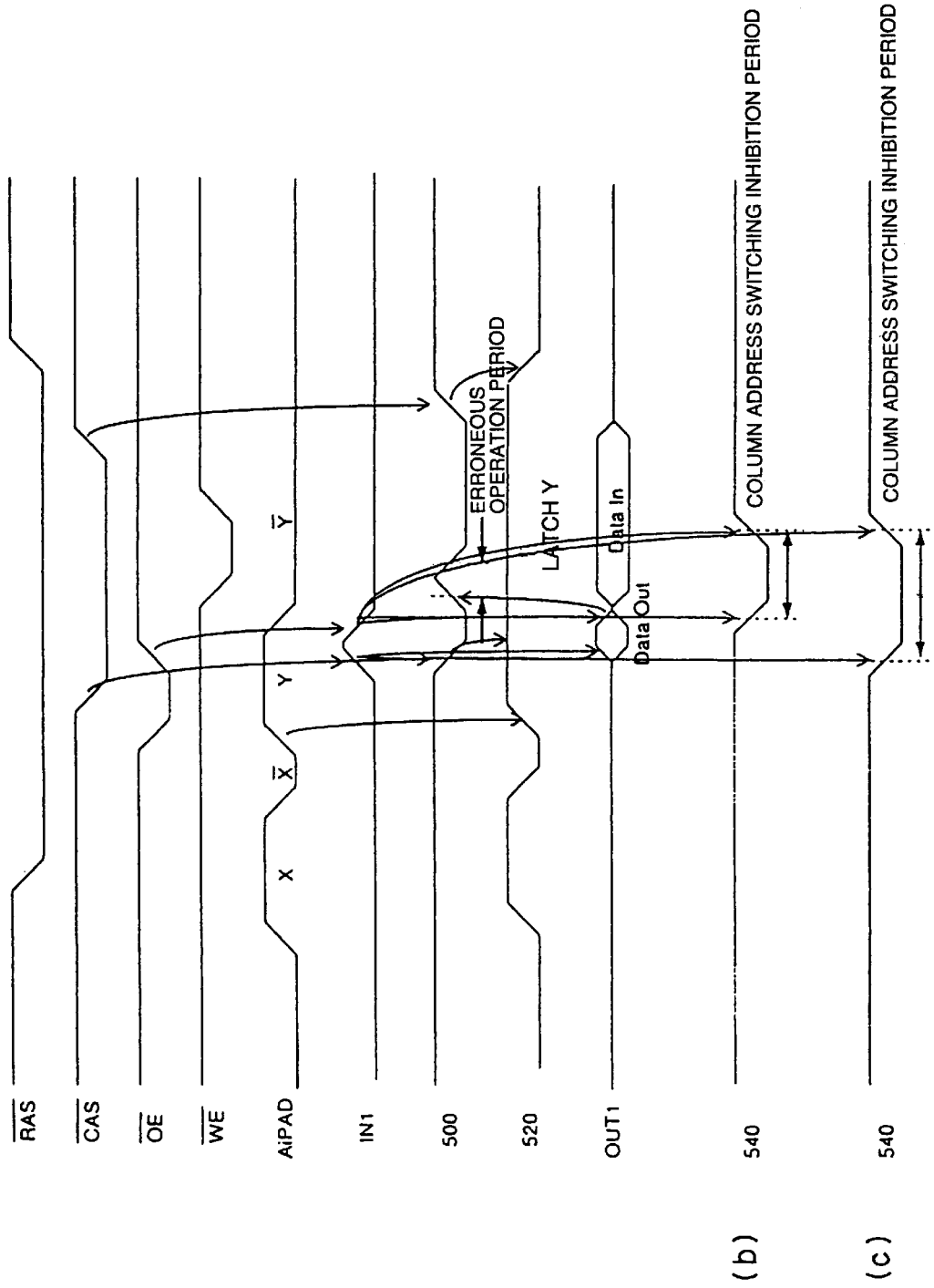

SEMICONDUCTOR DEVICE HAVING DELAY CIRCUIT FOR RECEIVING READ INSTRUCTION SIGNAL

TECHNICAL FIELD

The present invention relates to a semiconductor device having an output buffer. Particularly, the present invention relates to a semiconductor device having an output buffer circuit which generates less noise due to the operation of the buffer circuit, and a semiconductor device which less affects the operation of any external circuitry due to the noise.

BACKGROUND TECHNOLOGY

There is a conventional output buffer circuit as shown in FIG. 2.

The configuration of the conventional output buffer circuit is now explained hereinafter with reference to FIG. 2.

The output buffer circuit comprises an output terminal OUT1 on which output data appears, a p-channel MOS transistor (hereinafter referred to as PMOS) 129 and an n-channel MOS transistor (hereinafter referred to as NMOS) 130.

An output transistor control circuit for controlling operations of these PMOS 129 and NMOS 130 is connected to gate electrodes of the PMOS 129 and NMOS 130. The output transistor control circuit comprises inverters (hereinafter referred to as INVs) 120, 122, 125, 133, negative-conjunction circuits (hereinafter referred to as NAND circuits) 123 and 127. The output transistor and the inverters and NAND circuits in the output transistor control circuit are connected to one another as follows.

A read instruction signal IN1 is supplied to an input terminal of the INV 120, and a node 121 is connected to an output terminal of the INV 120. The node 121 is connected to an input terminal of the INV 122, and a node 110 is connected to an output terminal of the INV 122. An output signal node 131, to which a signal corresponding to data to be outputted from the output terminal OUT1 is inputted, is connected to an input terminal of the INV 133 and a node 132 is connected to an output terminal of the INV 133. The node 110 and the node 132 are connected to an input terminal of the NAND circuit 123, and a node 124 is connected to an output terminal of the NAND circuit 123, respectively. The node 110 and the output signal node 131 are connected to an input terminal of the NAND circuit 127, and a node 128 is connected to an output terminal of the NAND circuit 127, respectively. The node 124 is connected to an input terminal of the INV 125 and a node 126 is connected to an output terminal of the INV 125.

A source of the PMOS 129 is connected to a power supply VCC (a high voltage power supply is generally referred to as VCC) having a potential level of e.g. 3.3 V through a parasitic reactance L2 of a power supply wire (a parasitic reactance generated along a path extending from a package terminal to an inside wiring chip). A gate of the PMOS 129 is connected to the node 128 and a drain thereof is connected to the output terminal OUT1. A source of the NMOS 130 is connected to a ground GND (a low voltage power supply is generally referred to as VSS or GND) having a potential level of e.g. 0 V through a parasitic reactance L1 of a power supply (a parasitic reactance generated along a path ending from a package terminal to an inside wiring chip). A gate of the NMOS 130 is connected to the node 126 and a drain thereof is connected to the output terminal OUT1.

Connected to the input terminal of the INV 120 is a control circuit CONT1 for outputting read instruction signal IN1 corresponding to states of /RAS (Row Address Strobe Signal), /CAS (Column Address Strobe Signal), /OE (Output Enable Strobe Signal) and /WE (Write Enable Signal) respectively serving as multiple external input signals.

The control circuit outputs the read instruction signal IN1 which changes from "L" level to "H" level in the states where the /WE (Write Enable Signal) is "H" level and the /RAS (Row Address Strobe Signal), /CAS (Column Address Strobe Signal) and /OE (Output Enable Strobe Signal) respectively change from "H" level to "L" level. A capacitor C1 (normally 100 pF) is connected between the output terminal OUT1 and the ground GND. The capacitor C1 is provided outside the chip.

A resistor R1 is connected between the output terminal OUT1 and a reference voltage supply unit for supplying a reference voltage V2 (normally 1.4 V). The output terminal OUT1 and the reference voltage supply unit are also provided outside the chip.

The resistor R1, the capacitor C1 and the reference voltage supply unit respectively provided outside the chip are needed for operating the output buffer circuit.

The operation of the output buffer circuit shown in FIG. 2 will be now described with reference to FIG. 3.

i) In case that "H" level is outputted from the output terminal OUT1 (lower part in FIG. 3).

In a period for not reading data, since the states of /RAS, /CAS, /OE and /WE serving as the external input signals hold "H" level, the control circuit CONT1 outputs the read instruction signal IN1 of "L" level.

In case that the read instruction signal IN1 is "L" level, the node 128 goes to "H" level and the node 126 goes to "L" level so that both the PMOS 129 and NMOS 130 are turned off. Accordingly, the output terminal OUT1 outputs "Hi-Z" level. Whereupon, the output terminal OUT1 of the present circuit goes to "V2 level" by the resistor R1 and the reference voltage supply unit respectively provided outside the chip. Since this "V2 level" is an intermediate level between "H" level and "L" level, it is recognized that "V2 level" equals to "Hi-Z" level as viewed from an external device connected to the output terminal OUT1.

When the states of the /RAS, /CAS and /OE change from "H" level to "L" level while the /WE holds "H" level, the read instruction signal IN1 changes from "L" level to "H" level. At this time, when the output signal node 131 is "H" level, the node 128 goes to "L" level and the node 126 goes to "L" level so that the PMOS 129 is turned on and the NMOS 130 is turned off. When the PMOS 129 is turned on, a current i2 flows as shown in FIG. 2 so that the potential level of the output terminal OUT1 gradually increases. When the potential level of the output terminal OUT1 reaches a given value (VOH, e.g., 2.0 V) or more, it is decided that the potential level of the output terminal OUT1 is "H" level.

Thereafter, the read instruction signal IN1 changes from "H" level to "L" level. When the read instruction signal IN1 changes from "H" level to "L" level, the node 128 goes to "H" level so that the PMOS 129 is turned off. When the PMOS 129 is turned off, the potential level of the output terminal OUT1 gradually decreases and finally goes to "Hi-Z" level. (Since the potential level of the output terminal OUT1 returns to "Hi-Z" level, the operation thereof is hereinafter referred to as output reset).

ii) In case that "L" level is outputted from the output terminal OUT1 (upper part in FIG. 3).

On the other hand, since the node 128 goes to "H" level and the node 126 goes to "H" level when the output signal node 131 is "L" level in case that the read instruction signal IN1 changes from "L" level to "H" level, the PMOS 129 is turned off and the NMOS 130 is turned on. When the NMOS 130 is turned on, a current i1 flows as shown in FIG. 2 so that the potential level of the output terminal OUT1 gradually decreases. When the potential level of the output terminal OUT1 reaches a given value (VOL, i.e., 0.8 V) or less, it is decided that the potential level of the output terminal OUT1 is "L" level.

Thereafter, the read instruction signal IN1 changes from "H" level to "L" level. When the output terminal OUT1 changes from "H" level to "L" level, the node 126 goes to "L" level so that the NMOS 130 is turned off. When the NMOS 130 is turned off, the potential level of the output terminal OUT1 gradually increases, and finally goes to "Hi-Z" level. (Since the potential level of the output terminal OUT1 returns to "Hi-Z" level, the operation thereof is hereinafter referred to as output reset).

However, there was a case in the conventional output buffer circuit that the potential applied to the power supply VCC wire and GND wire varies largely (noise is generated).

For example, suppose that "L" level is outputted from the output terminal OUT1 (upper part in FIG. 3).

When the read instruction signal IN1 changes from "H" level to "L" level, the NMOS 130 is turned off so that the current i1 is cut off. However, if the current i1 is cut off before the potential level of the output terminal OUT1 fully decreases to the GND level, a reaction is enforced by a parasitic reactance L1 along with the power supply wire to preserve the existing current flow, then the potential applied to the GND wire inside the chip instantaneously drops to a negative level. (potential drop V=(L component)×(rate of change of current in terms of time).

Meanwhile, when "H" level is outputted from the output terminal OUT1 (lower part in FIG. 3), the potential which is applied to the power supply VCC wire inside the chip instantaneously drops to the potential level which is greater than VCC due to the effect of the parasitic reactance L2 on the power supply wire at the output reset time.

Further, there is a large capacitance between the power supply VCC and the ground GND, the potential applied to the power supply VCC wire inside the chip follows and varies.

When the potential applied to the power supply VCC wire the ground GND wire largely varies at the output reset time, there is a case that the control circuit CONT1 for outputting the read instruction signal IN1 erroneously recognizes the potential levels of multiple external input signals (/RAS, /CAS , /OE and /WE). As a result, there is a possibility that the read instruction signal IN1 of "H" level appears in a period other than a read period, and hence an improvement thereof is desired.

DISCLOSURE OF THE INVENTION

The present invention has been made to solve the problems as explained above, and to provide a typical semiconductor device comprising a control circuit for outputting a read instruction signal for a first period in response to multiple control signals, an output transistor control circuit for outputting an enable signal for a second period which is longer than the first period and an output transistor for driving an output terminal in response to the enable signal.

BRIEF DESCRIPTION OF THE DRAWINGS

FIG. 8 is a circuit diagram showing a third embodiment of the present invention.

FIG. 13 is a circuit diagram showing a fifth embodiment of the present invention.

FIG. 14 is a timing chart for explaining the operation of the circuit in FIG. 13.

BEST MODE FOR CARRYING OUT THE INVENTION

First Embodiment

Explanation of a Circuit Diagram

Figure 1:
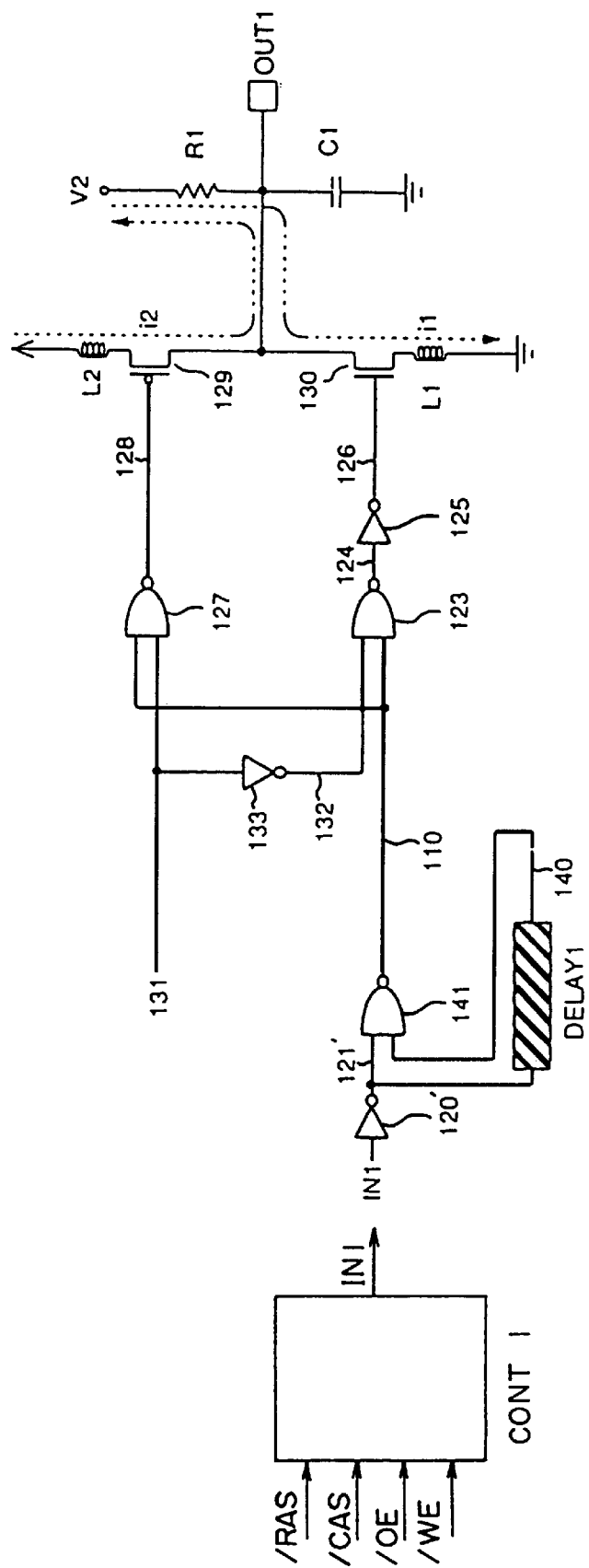
FIG. 1 is a circuit diagram showing a first embodiment of the present invention.

A first embodiment of the present invention will be now described with reference to FIG. 1.

A semiconductor device of the present invention comprises a control circuit CONT1 and an output buffer circuit. The output buffer circuit comprises a driving part composed of two output transistors and an output terminal and an output transistor control circuit for controlling the state of the driving part.

The driving part comprises an output terminal OUT1 on which output data appears, a p-channel MOS transistor (hereinafter referred to as PMOS) 129 and an n-channel MOS transistor (hereinafter referred to as NMOS) 130. An output transistor control circuit for controlling operations of these PMOS 129 and NMOS 130 is connected to gate electrodes of these PMOS 129 and NMOS 130.

The output transistor control circuit comprises inverters (hereinafter referred to as INVs) 125 and 133, and non-conjunction circuits (hereinafter referred to as NAND circuits) 123 and 127. The output transistor and the INVs and NAND circuits in the output transistor control circuit are connected to one another as follows.

An output signal node 131, to which a data signal corresponding to data to be outputted from the output terminal OUT1 is inputted, is connected to an input terminal of the INV 133, and a node 132 is connected to an output terminal of the INV 133. A node 110 and the node 132 are connected to input terminals of the NAND circuit 123, and a node 124 is connected to an output terminal of the NAND circuit 123, respectively. The node 110 and the node 131 are connected to input terminals of the NAND circuit 127 and a node 128 is connected to an output terminal of the NAND circuit 127, respectively. The node 124 is connected to an input terminal of the INV 125, and a node 126 is connected to an output terminal of the INV 125. An enable signal which permits the output transistor control circuit to be enable/disable state is supplied to the node 110.

A source of the PMOS 129 is connected to a power supply VCC (a power supply having high potential level is generally called as a VCC) having a potential of e.g. 3.3 V through a parasitic reactance L2 of a power supply wire (a parasitic reactance generated along a path extending from a package terminal to an inside chip wiring). A gate of the PMOS 129 is connected to the node 128 and a drain thereof is connected to the output terminal OUT1. A source of the NMOS 130 is connected to a ground GND (a power supply having a low potential level is generally called as VSS or GND) having a potential level of e.g. 0 V through a parasitic reactance L1 of a power supply wire (a parasitic reactance generated along a path extending from a package terminal to an inside chip wiring). A gate of the NMOS 130 is connected to the node 126 and a drain thereof is connected to the output terminal OUT1.

A control circuit CONT1 outputs a read instruction signal IN1 corresponding to a state of /RAS (Row Address Strobe Signal), /CAS (Column Address Strobe Signal), /OE (Output Enable Strobe Signal) and /WE (Write Enable Signal) respectively serving as multiple external input signals.

More in detail, the control circuit CONT1 outputs the read instruction signal IN1 which changes from "L" level to "H" level when the /WE (Write Enable Signal) is "H" level, and the states of the /RAS (Row Address Strobe Signal), /CAS (Column Address Strobe Signal) and /OE (Output Enable Strobe Signal) respectively change from "H" level to "L" level.

A capacitor C1 (normally 100 pF) is connected between the output terminal OUT1 and the ground GND. The capacitor C1 is provided outside the chip. Further, a resistor R1 is connected between the output terminal OUT1 and a reference voltage supply unit for supplying a reference voltage V2 (normally 1.4 V). The resistor R1 and the reference voltage supply unit are also provided outside the chip. The resistor R1, the capacitor C1 and the reference voltage supply unit respectively provided outside the chip are needed for operating the output buffer circuit.

Further, the semiconductor device of the present invention includes an enable signal generating circuit comprising an INV 120', a NAND circuit 141 and a delay circuit (hereinafter referred to as DELAY).

More in detail, the DELAY 1 comprising a plurality of even number staged inverters has an input terminal connected to a node 121' and an output terminal connected to a node 140. The NAND circuit 141 has two input terminals to which the node 121' and the node 140 are connected and an output terminal to which the node 110 is connected.

Explanation of Operation

Figure 2:
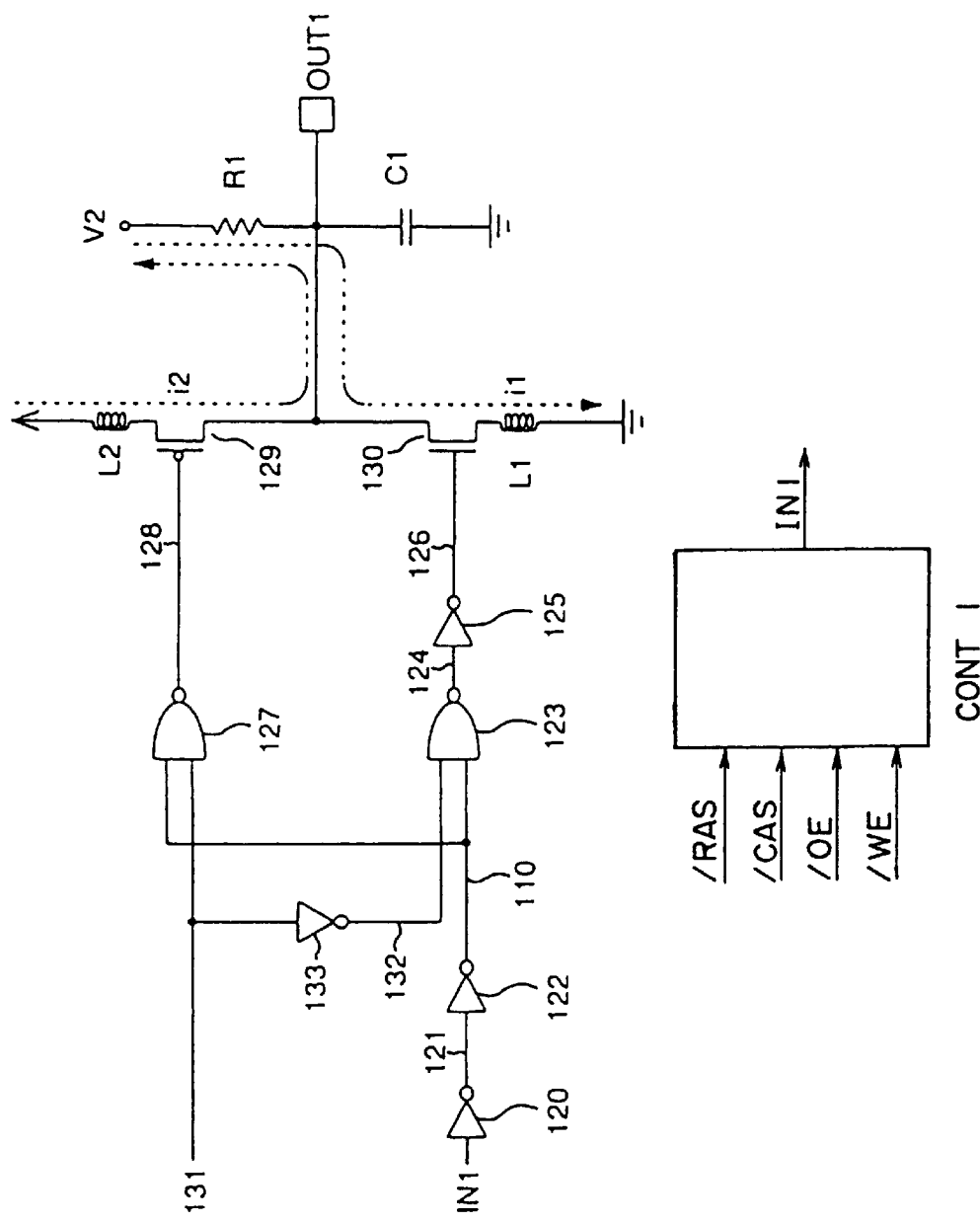
FIG. 2 is a circuit diagram showing a conventional output buffer circuit.
Figure 3:
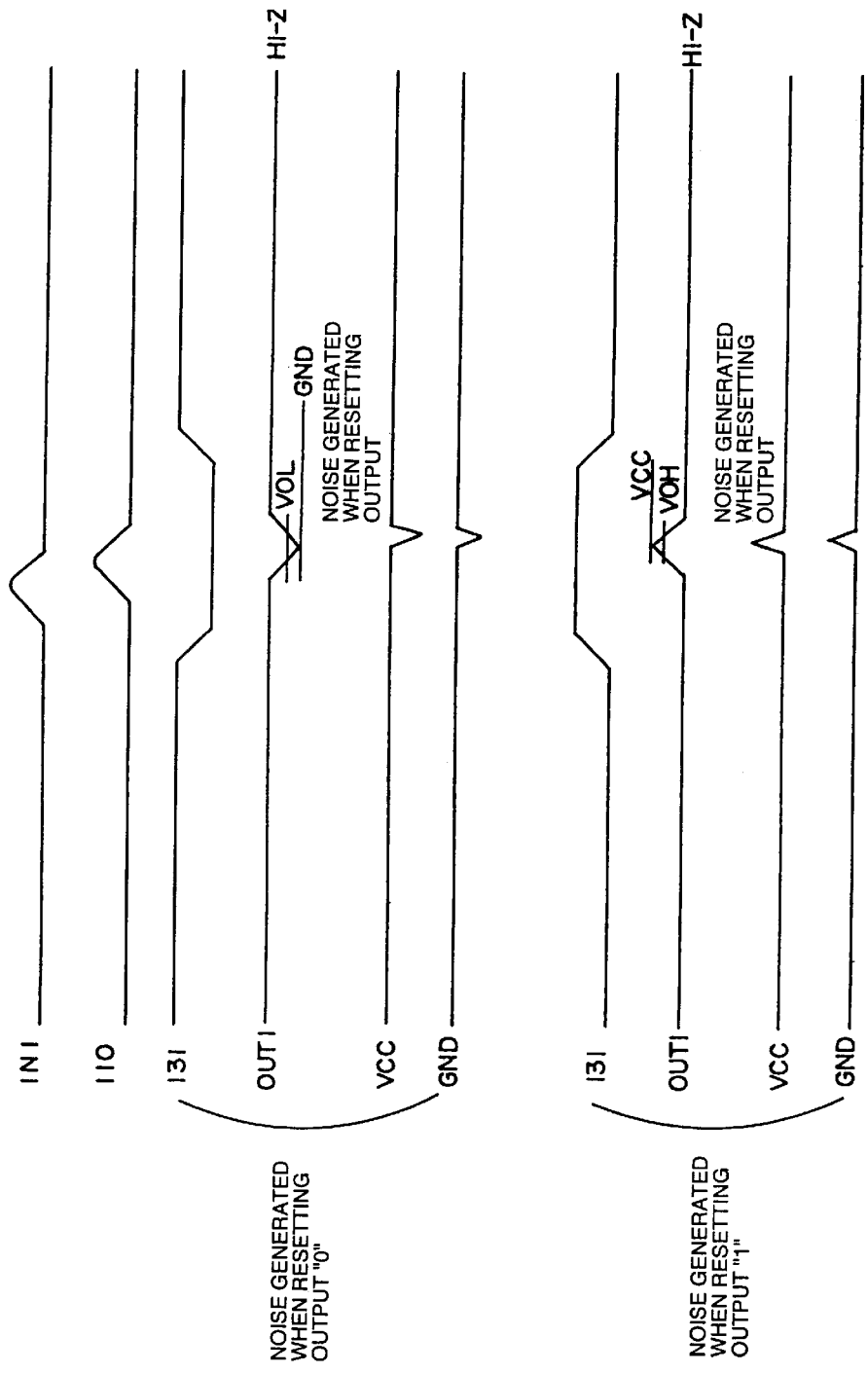
FIG. 3 is a timing chart for explaining the operation of the circuit in FIG. 2.
Figure 4:
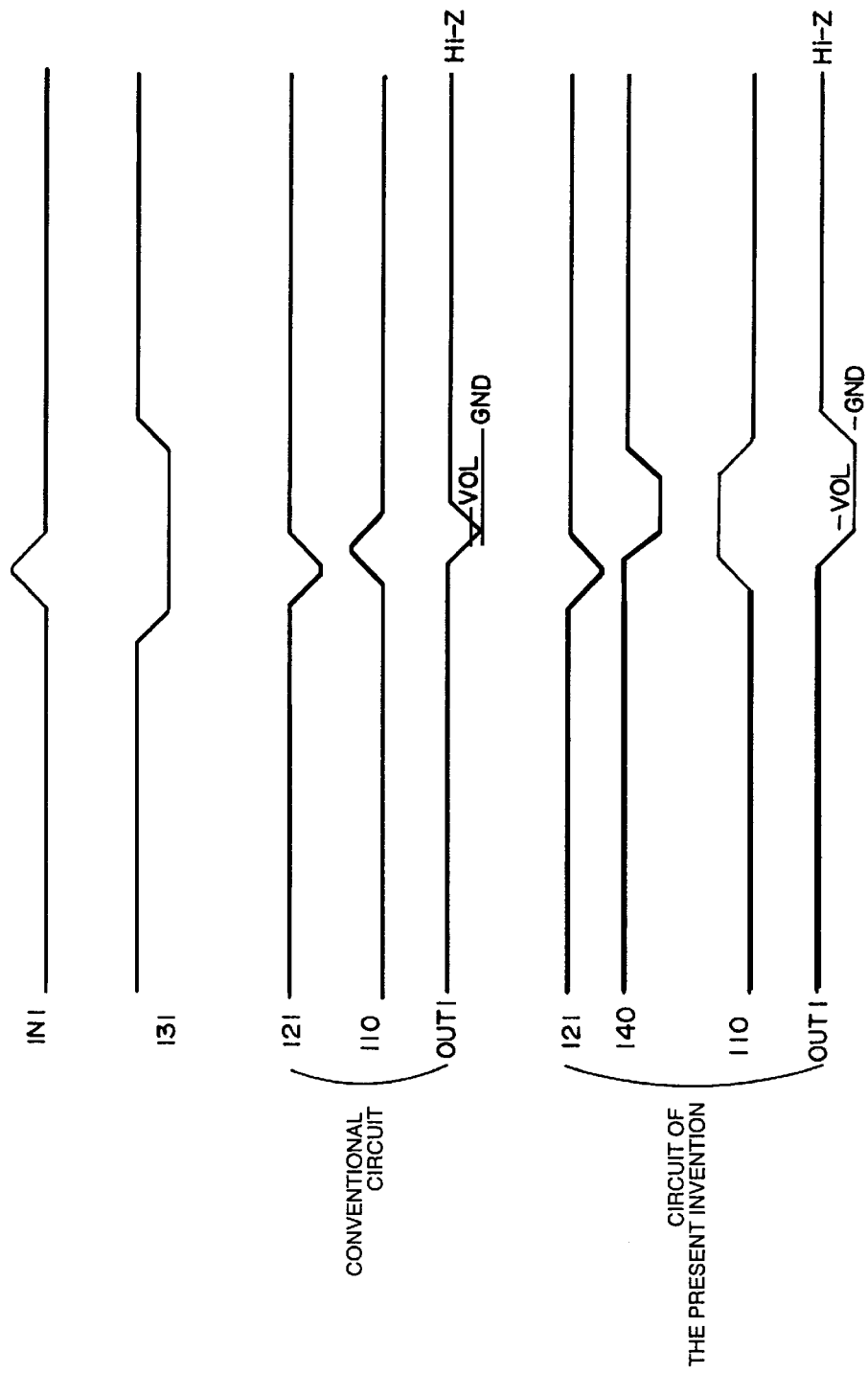
FIG. 4 is a timing chart for explaining the operation of the circuit in FIG. 1.

FIG. 4 is a timing chart showing the comparison between the operation of the circuit shown in FIG. 1 and that of the circuit shown in FIG. 2. Described hereinafter is a case when the output buffer circuit outputs "L" level.

First of all, the control circuit CONT1 detects that all the /RAS, /CAS and /OE respectively serving as the external input signals change from "H" level to "L" level and the /WE is "H" level. The control circuit CONT1 outputs the pulse-shaped read instruction signal IN1 to an input terminal of the INV 120'. A data signal output circuit, not shown, outputs a data signal of "L" level to the node 131 immediately before the control circuit CONT1 outputs the read instruction signal IN1.

When the read instruction signal IN1 changes from "L" level to "H" level, the node 121' changes from "H" level to "L" level. Since the node 121' changed to "L" level, the NAND circuit 141 outputs "H" level to the node 110 irrespective of the level of the node 140 (the node 140 is "H" level).

The DELAY 1 delays a signal supplied to the node 121' by a given time. Accordingly, the node 140 changes to "L" level upon elapse of the given time after the node 121' changed to "L" level.

Since the node 132 is "H" level and the node 110 is "H" level, the NAND circuit outputs "L" level to the node 124. Since the node 124 is "L" level, the node 126 changes from "L" level to "H" level. Since the node 126 changes from "L" level to "H" level, the NMOS 130 is turned on. As a result, a current in proportion to the difference in potential between the source and drain (VDS) of the NMOS 130 flows between the source and drain of the NMOS 130 so that the potential level of the output terminal OUT1 gradually decreases.

Thereafter, when the read instruction signal IN1 changes from "H" level to "L" level, the node 121' changes from "L" level to "H" level. However, the node 140 remains in "L" level due to the effect of the DELAY 1. Accordingly, the NAND circuit 141 outputs "H" level to the node 110 irrespective of the level of the node 121'. That is, the node 110 holds "H" level irrespective of the change of the read instruction signal IN1 from "H" level to "L" level. Accordingly, the NMOS 130 remains turned on for a sufficient time.

When the NMOS 130 remains turned on for a sufficient time, finally the VDS equals to 0 V so that the potential level of the output terminal OUT1 completely goes to GND level. At this time, since there is no difference in potential between the source and drain of the NMOS 130, a current scarcely flows. In this state, even if the NMOS 130 is turned off, the variation of the current relative to time is substantially zero.

The node 140 changes from "L" level to "H" level upon elapse of a given time. Since the node 121' is "H" level and the node 140 is "H" level, the NAND circuit 141 outputs "L" level to the node 110.

Since the node 110 is "L" level, the NAND circuit 123 outputs "H" level to the node 124 irrespective of the level of the node 132. Since the node 124 is "H" level, the node 126 changes from "H" level to "L" level. Since the node 126 changes from "H" level to "L" level, the NMOS 130 is turned off.

When the NMOS 130 is turned off, the potential level of the output terminal OUT1 goes to "Hi-Z" level.

Since the current i1 is cut off after the potential level of the output terminal OUT1 decreases to GND level according to the first embodiment of the present invention as set forth above, it is hardly affected by parasitic reactance L1 on the power supply wire. Accordingly, there is no possibility that the potential applied to the GND wire inside the chip instantaneously decreases to a negative level. (The amount of noise on the power supply VCC wire and the GND wire is extremely reduced).

In a DRAM requiring a high operation speed, a time reaching a GND level is not sufficiently taken in view of setting the specification of timings. That is, even if the potential level of the output terminal OUT1 does not reach a GND level, it is decided to be "L" level if it is a given level (VOL) or less. Accordingly, the pulse-shaped read instruction signal IN1 has hitherto turned off the NMOS 130 before the potential level of the output terminal OUT1 reaches GND level.

Suppose that the current i1 flows between the source and drain of the NMOS 130, the voltage V which drops to the ground wiring as explained above is given by (L component)×(rate of instantaneous change). From this expression, the current which flows when the NMOS 130 is turned off may be reduced to reduce the decreasing voltage.

Accordingly, the enable signal (a signal supplied to the node 110) having a width longer than a pulse width of the read instruction signal IN1 is produced in response to the pulse-shaped read instruction signal IN1 according to the first embodiment of the present invention.

As a result, since the NMOS 130 can be turned on for a longer time, the VDS between the source and drain of the NMOS 130 can be approached to 0 V so that the current which flows when the NMOS 130 is turned off can be more reduced.

Further, the current which flows when the NMOS 130 is turned off can be more reduced without changing the pulse width of the read instruction signal IN1. That is, the aforementioned drawbacks can be improved without reducing an access speed.

Although the case where the output buffer circuit outputs "L" level has been explained, this is applied to a case where the output buffer circuit outputs "H" level.

As a result, since the potential applied to the power supply VCC wire and the GND wire does not largely change at the output reset time, it is possible to prevent the control circuit CONT1 for outputting the read instruction signal IN1 from erroneously recognizing potential levels of the plurality of external input signals (/RAS, /CAS, /OE and /WE). Accordingly, it is possible to prevent the read instruction signal IN1 of "H" level from appearing in a period other than a read period.

According to the first embodiment of the present invention, a noise generated when the output buffer circuit operates is reduced. Meanwhile, embodiments including a second embodiment and succeeding embodiments described hereinafter have devised a circuit to prevent a noise, even if it is generated when the output buffer circuit operates, from influencing on other circuits or to prevent other circuits from erroneously operating.

Second Embodiment

A second embodiment relates to a circuit for preventing the reexecution of data read operation due to a noise (output reset noise) which is generated when an output buffer circuit operates in a semiconductor memory device, particularly in a DRAM. That is, even if the output reset noise is generated, the data read operation is inhibited.

Explanation of Circuit Diagram

Figure 5:
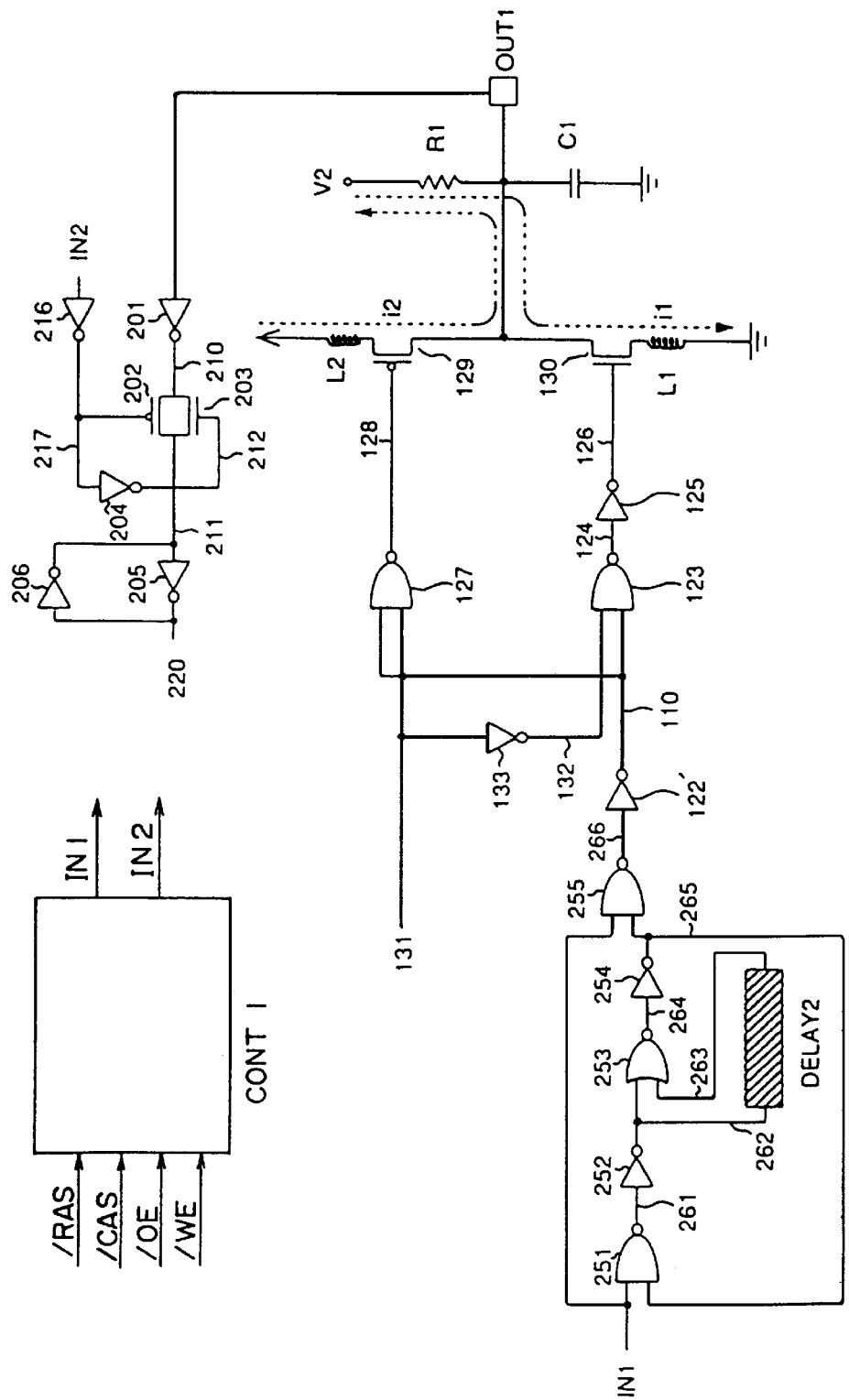
FIG. 5 is a circuit diagram showing a second embodiment of the present invention.

FIG. 5 is a circuit diagram showing a second embodiment of the present invention, and components which are the same as those in FIG. 2 are denoted by the same reference numerals.

The semiconductor device of the present invention comprises the control circuit CONT1, the output buffer circuit and a data-in-buffer circuit. Since the second embodiment includes the data-in-buffer circuit for inputting data therein, the output terminal OUT1 is explained as an input/output terminal OUT1.

The data-in-buffer circuit is connected to the input/output terminal OUT1. More in detail, the input/output terminal OUT1 is connected to an input terminal of an INV 201 and a node 210 is connected to an output terminal of the INV 201. A source of a PMOS 202 is connected to the node 210, a gate thereof is connected to a node 217 and a drain thereof is connected to a node 211. A source of an NMOS 203 connected to the node 211, a gate thereof is connected to a node 212 and a drain thereof is connected to the node 210. An input terminal of an INV 205 is connected to the node 211 and an output terminal thereof is connected to a node 220. An input terminal of an INV 206 is connected to the node 220 and an output terminal thereof is connected to the node 211.

An input terminal of an INV 216 is connected to the control circuit CONT1 for outputting a write data latch signal IN2 in response to the states of /RAS, /CAS, /OE and /WE serving as multiple external input signals.

The control circuit CONT1 outputs the read instruction signal IN1 which changes from "L" level to "H" level when the /WE is "H" level and the states of the /RAS, /CAS and /OE change from "H" level to "L" level, and outputs the write data latch signal IN2 which changes from "H" level to "L" level when the /OE is "H" level and the states of the /RAS, /CAS and /WE change from "H" level to "L" level.

The node 217 is connected to an output terminal of the INV 216. An input terminal of an INV 204 is connected to the node 217 and an output terminal thereof is connected to the node 212.

Explanation of the components of the output buffer circuit which are already explained with reference to FIG. 1 is omitted.

The output buffer circuit in FIG. 5 is different from that in FIG. 1 in respect of the structure of the output transistor control circuit for controlling the state of the driving part. Described hereinafter is the structure of the different output transistor control circuit.

Input terminals of a NAND circuit 251 are connected to the read instruction signal IN1 and a node 265 and an output terminal thereof is connected to a node 261. An input terminal of an INV 252 is connected to the node 261 and an output terminal thereof is connected to a node 262. An input terminal of a DELAY 2 comprising a plurality of odd number staged inverters is connected to the node 262 and an output terminal thereof is connected to a node 263. Input terminals of a negative-disjunction circuit (hereinafter referred to as NOR) 253 are connected to the nodes 262 and 263 and an output terminal thereof is connected to a node 264. An input terminal of an INV 254 is connected to the node 264 and an output terminal thereof is connected to the node 265. Input terminals of a NAND circuit 255 are connected to the node 265 and the read instruction signal IN1 and an output terminal thereof is connected to a node 266. An input terminal of an INV 122' is connected to the node 266 and an output terminal thereof is connected to the node 110.

Explanation of Operation

The operation of the semiconductor device shown in FIG. 5 will be now described with reference to timing charts shown in FIGS. 6 and 7.

Figure 6:
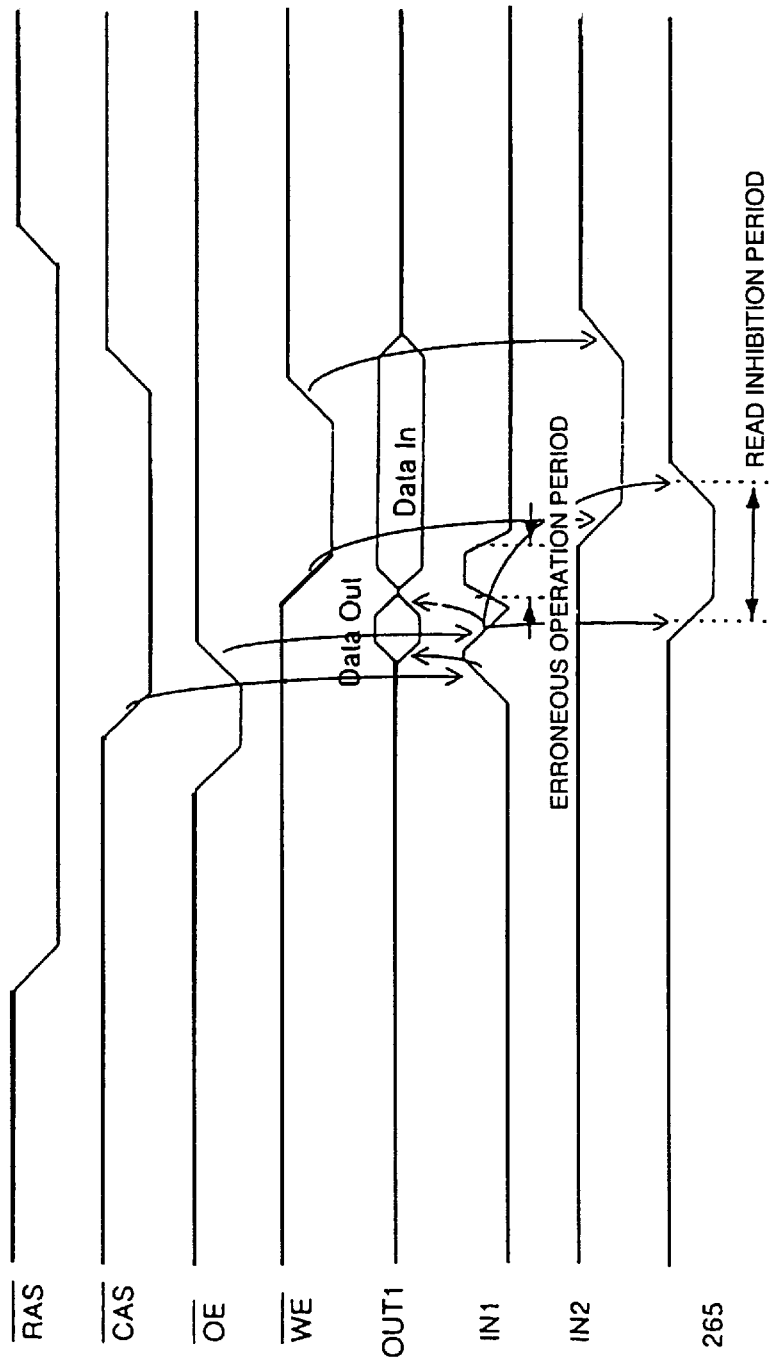
FIG. 6 is a timing chart for explaining the circuit in FIG. 5.
Figure 7:
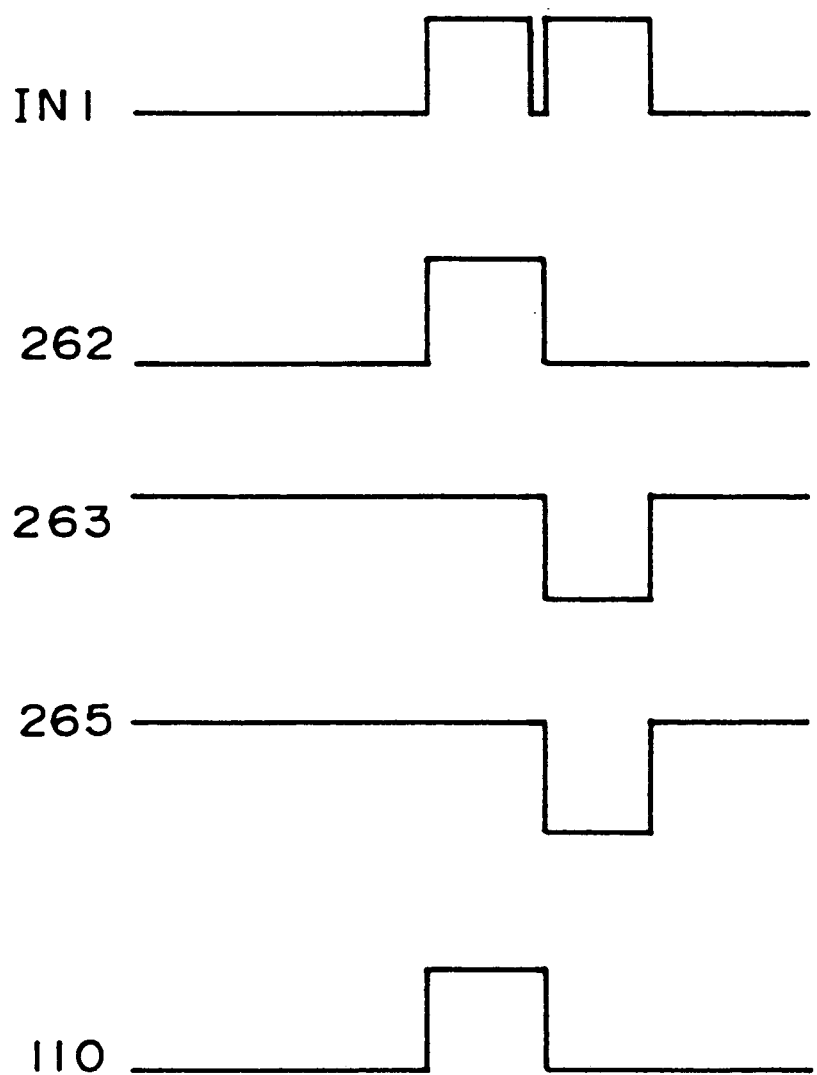
FIG. 7 is a timing chart for explaining the circuit in FIG. 5.

FIG. 6 is a timing chart for explaining cycles for performing write operation immediately after the read operation, and FIG. 7 is a timing chart for explaining the relation between the read instruction signal IN1 and each node.

First of all, the control circuit CONT1 detects that all the /RAS, /CAS and /OE serving as external input signals change from "H" level to "L" level, and the /WE is "H" level. The control circuit CONT1 outputs the pulse-shaped read instruction signal IN1 to the NAND circuits 251 and 255. Immediately before the control circuit CONT1 outputs the read instruction signal IN1, a data signal output circuit, not shown, outputs a data signal of "L" level or "H" level to the node 131. Suppose that the data is "L" level.

Since two input terminals of the NAND circuit 255 go to "H" level when the read instruction signal IN1 changes from "L" level to "H" level, the node 110 changes from "L" level to "H" level. When the node 110 changes to "H" level, the NAND circuit 123 outputs "L" level to the node 124. When the node 124 goes to "L" level, the NMOS 130 is turned on so that the output terminal OUT1 gradually decreases to the ground level.

Meanwhile, when the read instruction signal IN1 of "H" level is supplied to the NAND circuit 251, the node 262 changes from "L" level to "H" level. The node 263 changes from "H" level to "L" level upon elapse of a given time after the node 262 changes from "L" level to "H" level.

The NOR 253 outputs "L" level to the node 264 irrespective of the change of the read instruction signal IN1 since the node 262 or the node 263 is "H" level. Accordingly, the level of the node 265 does not change.

Thereafter, when the /OE changes from "L" level to "H" level and the read instruction signal IN1 changes from "H" level to "L" level, one input terminal of the NAND circuit 255 goes to "L" level, the node 110 changes from "H" level to "L" level. When the node 110 changes to "L" level, the NAND circuit 123 outputs "H" level to the node 124. When the node 124 goes to "H" level, the NMOS 130 is turned off.

Hereupon, there is a possibility of generation of a large noise in the power supply VCC and the GND because of the generation of a reset noise as explained before. There is a possibility that the control circuit recognizes that the potential level of the /OE is "L" level although the /RAS and /CAS are primarily "L" level and the /WE and /OE are primarily "H" level (the VIH level of the /OE is not held) due to the noise. If the potential level of the /OE is "L" level (erroneous operation period in FIG. 6), the control circuit decides that the read operation should start and allows the read instruction signal IN1 to change again from "L" level to "H" level.

However, since the node 263 goes to "L" level upon elapse of time which is determined by the DELAY 2, the NOR 253 outputs the "H" level signal to the node 264. Accordingly, since the node 265 goes to "L" level, the output of the NAND circuit 255 does not change. That is, even if the output reset noise is generated and the read instruction signal IN1 of "H" level is again issued, the read operation is inhibited to be executed again.

Although the write operation is executed after the read operation, if the read operation is executed again at this time, the data is read again from the input/output terminal OUT1, and it collides with the write data to be supplied to the input/output terminal OUT1. That is, the write data latch signal IN2 changes from "H" level to "L" level before the nodes 211 and 220 change to the correct input data. As a result, both the PMOS 202 and NMOS 203 serving as a transfer gate are turned off so as to execute a latch operation. Accordingly, it means that the data-in-buffer can not write correct data.

However, since the read operation is inhibited during a certain period after the primary read operation, the read data does not collide with the write data even if the write operation is executed after the read operation.

Third Embodiment

A third embodiment relates to a circuit for preventing an erroneous data write operation from being erroneously executed by a noise (output reset noise) which is generated when an output buffer circuit operates in a semiconductor memory device, particularly in a DRAM.

Explanation of Circuit Diagram

The third embodiment of the present invention will be now described with reference to FIG. 8.

FIG. 8 is a circuit diagram showing the third embodiment of the present invention wherein components which are the same as those in FIG. 2 are denoted by the same reference numerals. The explanation for the components which are the same as those is FIG. 2 is omitted.

The semiconductor device of the present invention comprises the control circuit CONT1, an output buffer circuit and a data-in-buffer circuit. The semiconductor device of the present invention is particularly characterized in the data-in-buffer circuit.

Explained first is FIG. 8(a). Input terminals of a NOR 341 are connected to the write data latch signal IN2 and a node 340 and an output terminal thereof is connected to a node 342. An input terminal of the INV 204 is connected to a node 342 and an output terminal thereof is connected to the node 212, respectively. A source of the PMOS 202 is connected to the node 210, a gate thereof is connected to a node 342 and a drain thereof is connected to the node 211, respectively. A source of the NMOS 203 is connected to the node 211, a gate thereof is connected to the node 212 and a drain thereof is connected to the node 210, respectively.

According to the third embodiment of the present invention, a circuit in FIGS. 8(b) or 8(c) as described hereinafter is connected to the node 340 in FIG. 8(a).

First, in FIG. 8(b), the IN1 and a node 350 are connected to an input terminal of the NOR 351 and a node 340 is connected to an output terminal of the NOR 351, respectively. The IN1 is connected to an input terminal of a DELAY 3 comprising a plurality of odd number staged inverters and the node 350 is connected to an output terminal of the DELAY 3, respectively.

In FIG. 8(c), a node 353 and a node 354 are connected are connected to input terminals of a NAND 355 and the node 340 is connected to an output terminal of the NAND 355, respectively. The IN1 is connected to an input terminal of an INV 352 and the node 353 is connected to an output terminal of the INV 352, respectively. The IN1 is connected to an input terminal of a DELAY 4 comprising plurality of even number stages of inverters and the node 354 is connected to an output terminal of the DELAY 4, respectively.

Explanation of Operation

Next, the operation of the circuits shown in FIGS. 8(a) and (b) will be now described with reference to a timing chart shown in FIG. 9.

Figure 9:
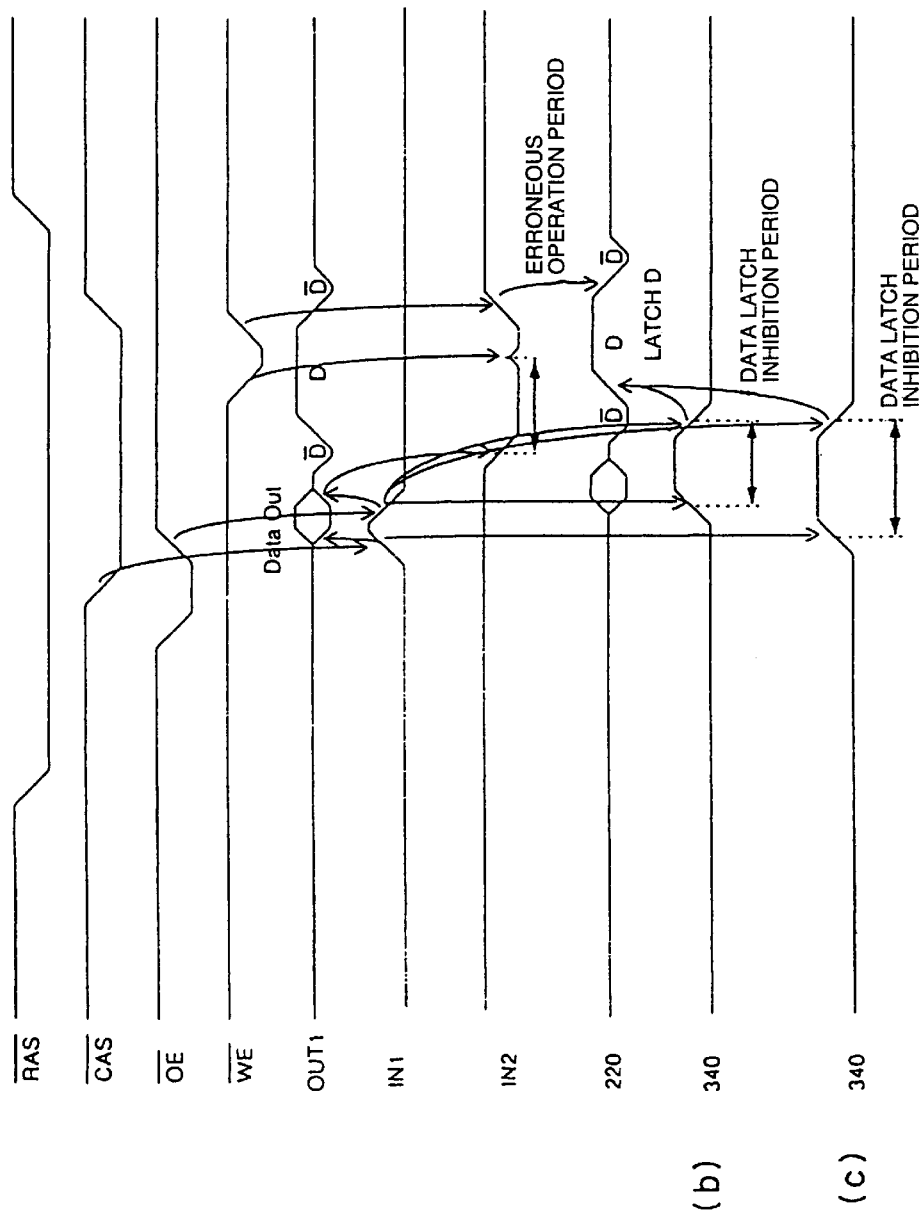
FIG. 9 is a timing chart for explaining the operation of the circuit in FIG. 8.

FIG. 9 shows a timing chart for explaining the cycles for executing the write operation immediately after the read operation.

First of all, the control circuit CONT1 detects that all the /RAS, /CAS and /OE serving as external input signals change from "H" level to "L" level, and that the /WE is "H" level. The control circuit CONT1 outputs the pulse-shaped read instruction signal IN1 to the NAND circuits 251 and 255. Immediately before the control circuit CONT1 outputs the read instruction signal IN1, a data signal output circuit, not shown, outputs a data signal of "L" level or "H" level to the node 131. Suppose here that the data is "L" level.

When the read instruction signal IN1 changes from "L" level to "H" level, the node 110 changes from "L" level to "H" level. When the node 110 changes to "H" level, the NAND circuit 123 outputs "L" level to the node 124. When the node 124 goes to "L" level, the NMOS 130 is turned on so that the output terminal OUT1 gradually decreases to the ground level.

Thereafter, when the /OE changes from "L" level to "H" level and the read instruction signal IN1 changes from "H" level to "L" level, the node 110 changes from "H" level to "L" level. When the node 110 changes to "L" level, the NAND circuit 123 outputs "H" level to the node 124. When the node 124 goes to "H" level, the NMOS 130 is turned off.

Meanwhile, when the read instruction signal IN1 goes to "L" level, the NOR circuit 351 outputs "H" level to the node 340. The reason is that the level of the node 350 holds "L"

level due to the DELAY 3 until the elapse of a given time after the IN1 changed to "L" level.

Hereupon, there is a possibility of generation of a large noise in the power supply VCC and the GND because of the generation of a reset noise as explained before. There is a possibility that the control circuit recognizes that the potential level of the /WE is "L" level although the /RAS and /CAS are primarily "L" level and the /WE and /OE are primarily "H" level (the VIH level of the /WE is not held) due to the noise. If the potential level of the /WE is "L" level (erroneous operation period in FIG. 9), there is a possibility that the control circuit CONT1 decides that the write data should be latched although data D to be written is not yet present on the input/output terminal OUT 1 (suppose that the data /D is present the input/output terminal OUT 1 at present). Based on such decision, the control circuit CONT1 changes write data latch signal IN2 from "H" level to "L" level. When the write data latch signal IN2 changes to "L" level, the PMOS 202 and NMOS 203 of the transfer gate are both turned off, so that the INV 205 and the INV 206 latch the data /D on the node 211 and the node 220.

If the primary write operation starts while holding this state, correct data can not be written.

However, according to the third embodiment of the present invention, a signal, which changes from "L" level to "H" level at the trailing edge of the read instruction signal IN1 from "H" level to "L" level and holds "H" level until a given time elapses from the trailing edge of the read instruction signal IN1, is outputted to the node 340. Further, this signal and the write data latch signal IN2 are NORed to produce a signal which is used as a control signal of the transfer gate.

Accordingly, since the node 340 holds "H" level for a given time although the write data latch signal IN2 changes to "L" level, the node 342 also holds "L" level for a given time. Consequently, the PMOS 202 and the NMOS 203 constituting the transfer gate holds on state, and hence the data /D is not latched.

Thereafter, a circuit, not shown, connected to the input/output terminal OUT1 outputs the data D to the input/output terminal OUT1.

Then, the /WE changes from "H" level to "L" level and the write data latch signal IN2 changes to "L" level. Since the level of the node 340 already changed to "L" level at this time, the node 342 changes to "H" level. Accordingly, the data of the input/output terminal OUT1 is first latched in the data-in-buffer.

According to the third embodiment of the present invention shown in FIG. 8(c), when the read instruction signal IN1 changes to "H" level, the NAND circuit 355 outputs "H" level to the node 340. The reason is that the level of the node 354 is held "H" due to the DELAY 4 until the elapse of a given time after the read instruction signal IN1 changed to "H" level.

According to the third embodiment of the present invention, a signal, which changes from "L" level to "H" level at the leading edge of the read instruction signal IN1 from "L" level to "H" level and held "H" level until a given time elapses from the leading edge of the read instruction signal IN1, is outputted to the node 340. Further, this signal and the write data latch signal IN2 are NORed to produce a signal which is used as a control signal of the transfer gate.

Accordingly, since the node 340 holds "H" level for a given time although the write data latch signal IN2 changes to "L" level, the node 342 also holds "L" level for a given time. Consequently, the PMOS 202 and the NMOS 203 constituting the transfer gate holds on state, and hence the data /D is not latched.

As mentioned above, according to the third embodiment of the present invention (FIGS. 8(a) to (c)), even if the control circuit CONT1 outputs the write data latch signal IN2 due to the output reset noise, the latching of the write data is inhibited for a certain period, thereby preventing the erroneous writing of data.

Particularly, according to the third embodiment of the present invention (FIGS. 8(a) and (c)), since the latching of the write data is inhibited from the early stage of the data read period, it is effective not only to the output reset noise but also to the erroneous operation caused by the noise generated at the early stage of reading data.

Fourth Embodiment

A fourth embodiment of the present invention relates to a circuit for preventing the data write operation from being erroneously executed by a noise (output reset noise) which is generated when an output buffer circuit operates in a semiconductor memory device, particularly in a DRAM.

Explanation of Circuit Diagram

The fourth embodiment of the present invention will be now described with reference to FIG. 10.

Figure 10:
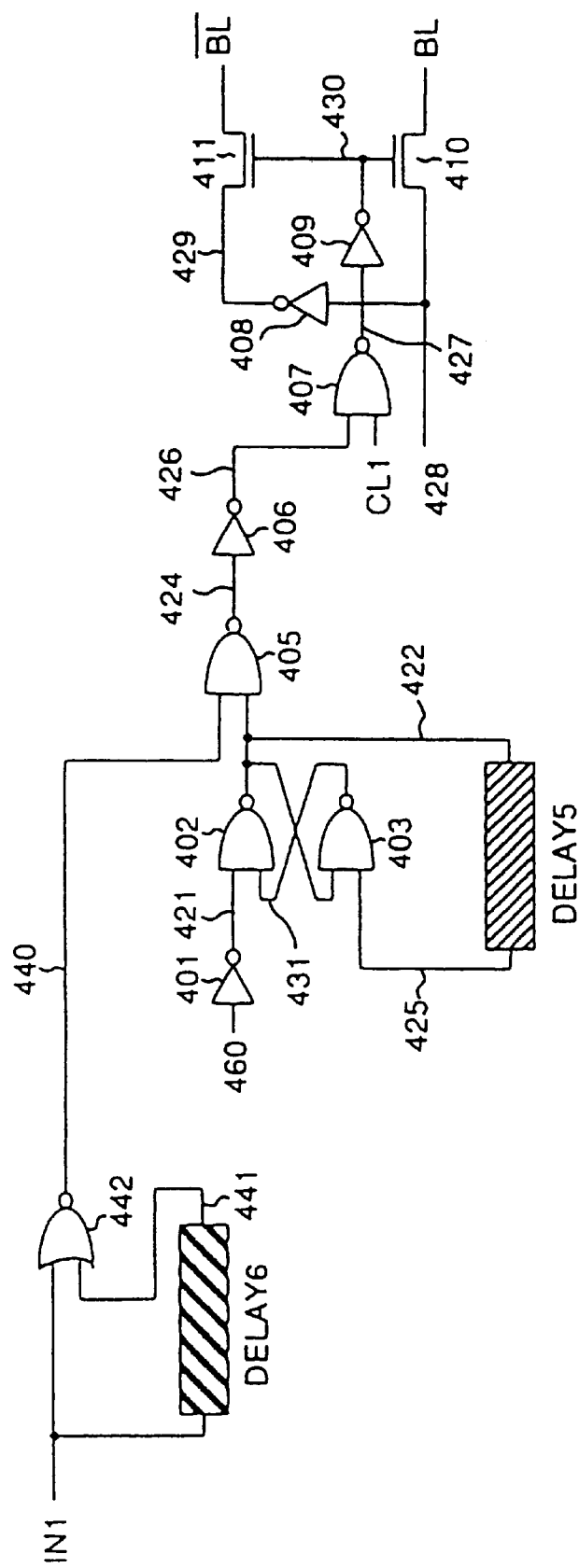
FIG. 10 is a circuit diagram showing a fourth embodiment of the present invention.

FIG. 10 is a write control circuit of the present invention.

A node 460, to which a write instruction signal which changes from "L" level to "H" level when all the /RAS, /CAS and /WE change from "H" level to "L" level is supplied, is connected to an input terminal of INV 401 and a node 421 is inputted to an output terminal of the INV 401, respectively. A NAND 402 and a NAND 403 constitute a flip-flop circuit, and a node 421 and a node 431 are connected to input terminals of the NAND 402 and a node 422 is connected to an output terminal of the NAND 402, respectively. A node 425 and the node 422 are connected to input terminals of the NAND 403 and the node 431 is connected to an output terminal of the NAND 403, respectively. The node 422 is connected to an input terminal of a DELAY 5 comprising a plurality of odd number staged inverters and the node 425 is connected to an output terminal of the DELAY 5, respectively.

The read instruction signal IN1 and a node 441 are connected to input terminals of a NOR circuit 442 and a node 440 is connected to an output terminal of the NOR circuit 442. A DELAY 6 comprising a plurality of even number staged inverters is connected between one input terminal of the NOR circuit 442 and the other input terminal of the NAND 402.

The node 440 and the node 422 are connected to input terminals of a NAND 405 and a node 424 is connected to an output terminal of the NAND 405, respectively. The node 424 is connected to an input terminal of an INV 406 and a node 425 is connected to an output terminal of the INV 406, respectively. A node 426 and a column address selection signal CL1 are connected to input terminal of a NAND 407 and a node 427 is connected to an output terminal of the NAND 407, respectively. The node 427 is connected to an output terminal of an INV 409 and a node 430 is connected to an output terminal of the INV 409, respectively. A node 408 for write data is connected to an input terminal of an INV 408 and a node 429 is connected to an output terminal of the INV 408, respectively. A source of an NMOS 410 is connected to a bit line (BL), a gate thereof is connected to the node 430 and a drain thereof is connected to the node 428, respectively. A source of an NMOS 411 is connected to a bit line bar (/BL), a gate thereof is connected to the node 430 and a drain thereof is connected to the node 429, respectively.

Explanation of Operation

Figure 11:
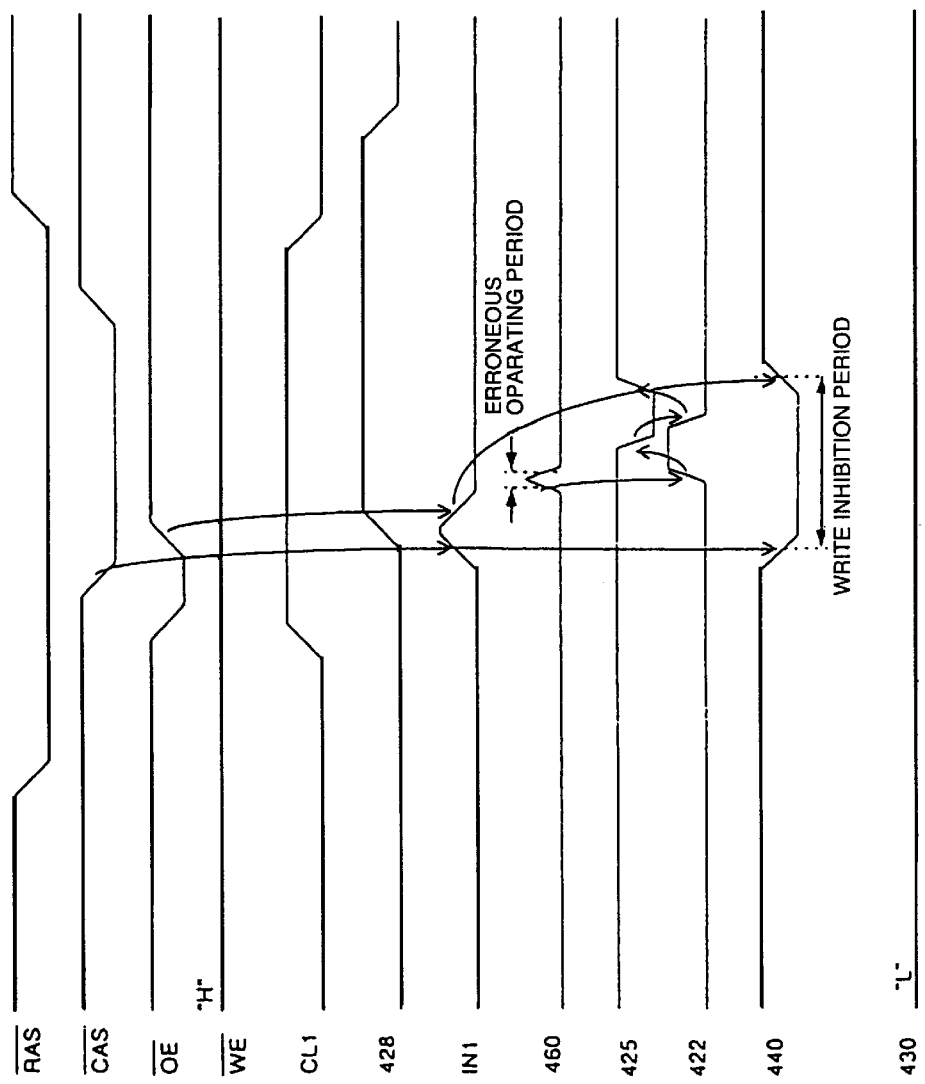
FIG. 11 is a timing chart for explaining the operation of the circuit in FIG. 10.
Figure 12:
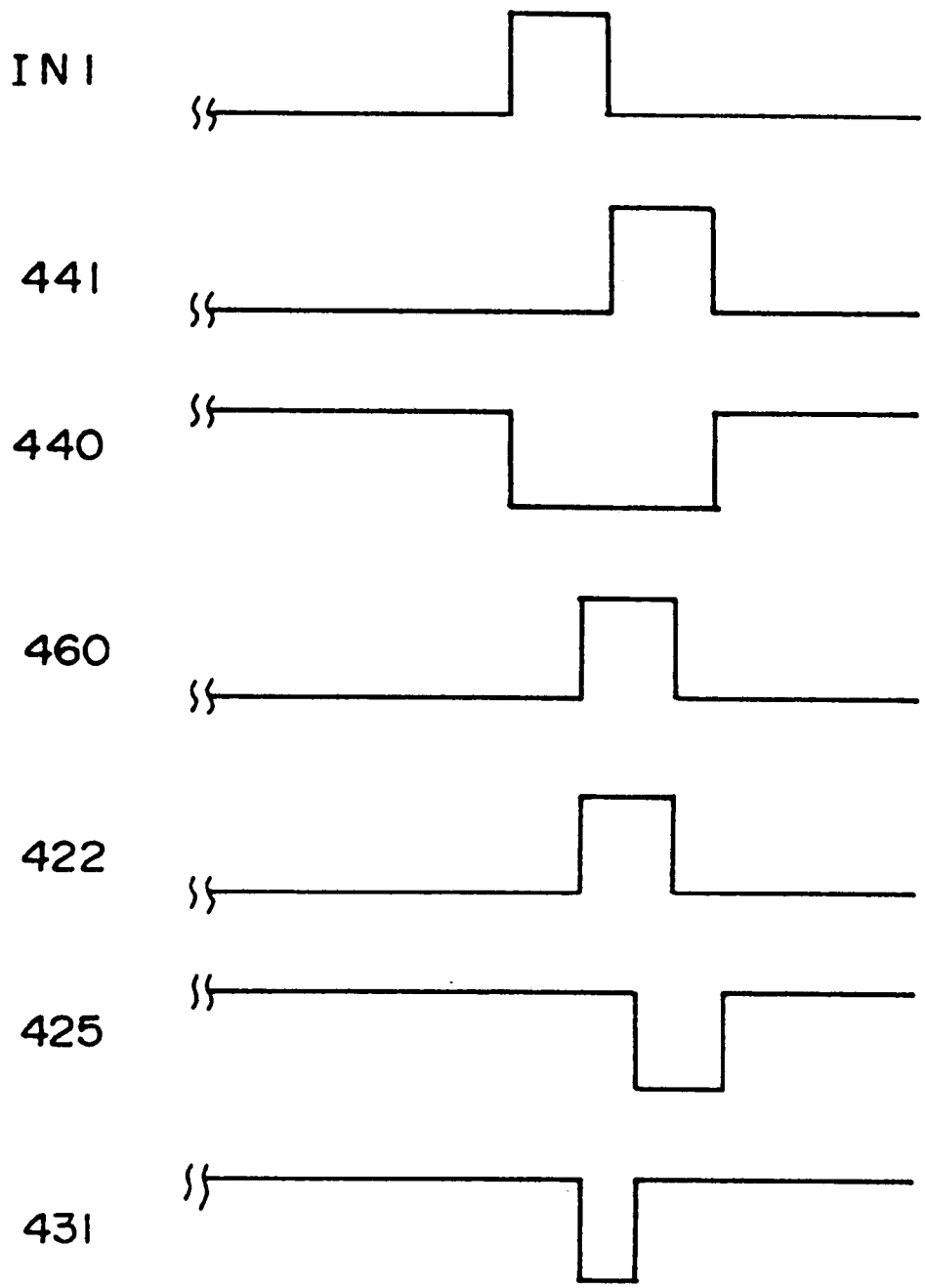
FIG. 12 is a timing chart for explaining the operation of the circuit in FIG. 10.

The operation of the circuit shown in FIG. 10 will be now described with reference to timing charts shown in FIG. 11 and FIG. 12.

The read instruction signal IN1 changes from "L" level to "H" level when all the /RAS, /CAS and /OE change from "H" level to "L" level, and the /WE is "H" level. Then, the data output buffer circuit explained above executes the data read operation.

When the read instruction signal IN1 goes to "H" level, the NOR circuit 442 outputs "L" level to the node 440. The DELAY 6 outputs "H" level upon elapse of a given time after the read instruction signal IN1 changed to "H" level. Accordingly, the NOR circuit 442 holds "L" level until the node 441 changes to "L" level after the read instruction signal IN1 changed to "H" level.

When the read instruction signal IN1 changes to "L" 'level, there is a possibility of generation of the output reset noise by the read operation as explained before. When the output reset noise is generated, the control circuit CONT1 decides that /WE which is primarily "H" level is "L" level. As a result, when the read instruction signal IN1 changes to "L" level, the control circuit CONT1 supplies the write instruction signal of "H" level to the node 460.

When the node 460 goes to "H" level, the node 422 goes to "H" level. Since the node 425 is "H" level at this time, the node 431 goes to "L" level. "L" level of the node 431 is held until the elapse of the delay time of the DELAY 5.

THE DELAY 5 outputs "L" level to the node 425 upon elapse of a given time. When the node 425 goes to "L" level, the node 431 goes to "H" level. When the node 431 is "H" level, a level corresponding to the write instruction signal appears on the node 422.

Suppose that the control circuit CONT1 supplies the write instruction signal of "H" level to the node 460 due to the output reset noise. Accordingly, the node 422 is "H" level. However, since the /WE is not "L" level in this period, the write control circuit shall not execute the write operation.

According to the present invention, a signal, which changes from "H" level to "L" level at the leading edge of the read instruction signal IN1 from "L" level to "H" level and holds "L" level until a given time elapses after the change from "H" level to "L" level, is outputted to the node 440. Accordingly, since the node 440 is "L" level even if the node 422 goes to "H" level, the node 424 does not go to "L" level. Since the transistors 410 and 411 are not turned on unless the node 424 does not go to "L" level, data is not written in the bit line.

Thereafter, /WE goes to "L" level at the entrance of the primary write period (not shown) so that the control circuit CONT1 outputs the write instruction signal of "H" level to the node 460.

When the node 460 goes to "H" level, the node 424 goes to "H" level as explained before. At the time, since the node 440 went to "H" level, the node 424 goes to "L" level.

At this time, if the column address selection signal CL1 is "H" level, the NAND circuit 407 outputs a signal of "L" level to the node 427, the transistors 410 and 411 are turned on. Accordingly, data supplied to the node 428 is written in the bit lines BL and /BL.

As mentioned above, according to the fourth embodiment of the present invention, even if the control circuit CONT1 outputs the write instruction signal of "H" level due to the output reset noise, the writing is inhibited for a certain period, thereby preventing the erroneous data writing.

Fifth Embodiment

A fifth embodiment of the present invention relates to a circuit for preventing a column address buffer circuit from erroneously operating by a noise (output reset noise) which is generated when an output buffer circuit operates in a semiconductor memory device, particularly in a DRAM.

Explanation of Circuit Diagram

The semiconductor device of the fifth embodiment is particularly characterized in the column address buffer circuit.

FIG. 13(a) is first explained.

An address input PAD (AiPAD) is connected to an input terminal of an INV 501 and a node 510 is connected to an output terminal of the INV 501, respectively. The node 510 is connected to a source of a PMOS 502, a node 513 is connected to a gate of the PMOS 502, and a node 511 is connected to a drain of the PMOS 502, respectively. The node 511 is connected to a source of an NMOS 503, a node 512 is connected to a gate of the NMOS 503, and the node 510 is connected to a drain of the NMOS 503, respectively.

A node 500, to which a column address latch signal, which changes from "H" level to "L" level when both the /RAS and /CAS change from "H" level to "L" level is supplied, and a node 540 are connected to input terminals of a NAND circuit 531 and a node 532 is connected to an output terminal of the NAND circuit 531, respectively. The node 532 is connected to an input terminal of an INV 504 and the node 512 is connected to an output terminal of the INV 504, respectively. The node 511 is connected to an input terminal of an INV 505 and a node 520 is connected to an output terminal of the INV 505, respectively. The node 520 is connected to an input terminal of an INV 506 and the node 511 is connected to an output terminal of the INV 506, respectively.

In the fifth embodiment of the present invention, a circuit shown in FIG. 13(b) or a circuit shown in FIG. 13(c) is connected to the node 540 shown in FIG. 13(a).

First in FIG. 13(b), the read instruction signal IN1 and a node 541 are connected to input terminals of a NOR 542 and a node 543 is connected to an output terminal of the NOR 542, respectively. The node 543 is connected to an input terminal of an INV 544 and a node 540 is connected to an output terminal of the INV 544, respectively. The read instruction signal IN1 is connected to an input terminal of a DELAY 7 comprising a plurality of odd number staged inverters and the node 541 is connected to an output terminal of the DELAY 7.

In FIG. 13(c), the read instruction signal IN1 and a node 550 are connected to input terminals of a NOR 551 and the node 540 is connected to an output terminal of the NOR 551, respectively. The output signal is connected to an input terminal of a DELAY 8 comprising a plurality of even number staged inverters and the node 550 is connected to an output terminal of the DELAY 8.

Explanation of Operation

The operation of the circuit shown in FIG. 13 will be now described with reference to a timing chart shown in FIG. 14. FIG. 14 shows a timing chart for explaining the cycles for executing the write operation immediately after the read operation.

First of all, the control circuit CONT1 detects that all the /RAS, /CAS and /OE serving as external input signals change from "H" level to "L" level, and that the /WE is "H" level. The control circuit CONT1 outputs the pulse-shaped read instruction signal IN1.

Further, since the /RAS and /CAS are "L" level, the control circuit CONT1 outputs the column address latch signal of "L" level to the node 500.

When the node 500 goes to "L" level, the NAND circuit 531 outputs a signal of "L" level to the node 532 irrespective of the level of the node 540. When the node 532 goes to "L" level, the transfer gate comprising the PMOS 502 and the NMOS 503 is turned off so that an address Y which is supplied to the address pad immediately before the transfer gate is turned off is latched.

When the address is latched, reading operation of data is executed based on the latched address Y as explained above.

Thereafter, the /OE changes from "L" level to "H" level, the read instruction signal IN1 changes from "H" level to "L" level.

Meanwhile, when the read instruction signal IN1 goes to "L" level, the NOR circuit 542 outputs "H" level to the node 543. The reason is that the level of the node 541 holds "L" level due to the DELAY 7 until the elapse of a given time after the read instruction signal IN1 changed to "L" level.

Hereupon, there is a possibility of generation of a large noise in the power supply VCC and the GND because of the generation of a reset noise as explained before. There is a possibility that the control circuit recognizes that the potential level of the ICAS is "H" level although the /RAS and /CAS are primarily "L" level (the VIL level of the /CAS is not held) due to the noise.

Erroneous Operation Period in FIG. 14

If the potential level of the /CAS is "H" level, the latching of the address /Y to be fetched during a write period is released, thereby fetching the address Y. At this stage, if the address Y is fetched, data is written into the memory cell corresponding to the address /Y during a write period.

However, according to the fifth embodiment of the present invention, a signal, which changes from "H" level to "L" level at the trailing edge of the read instruction signal IN1 from "H" level to "L" level and holds "L" level until a given time elapses from the trailing edge of the read instruction signal IN1, is outputted to the node 540. Further, this signal and the column address latch signal are NANDed to produce a signal which is used as a control signal of the transfer gate.

Accordingly, since the node 540 holds "L" level for a given period although the write column address latch signal changes to "H" level, the node 532 also holds "H" level for a given period. Consequently, the column address /Y is not fetched because the PMOS 502 and the NMOS 503 constituting the transfer gate holds off state.

At this stage since the transfer gate is turned off although /WE changes from "H" level to "L" level to execute the write operation, data is written into the memory cell corresponding to the address /Y which is already latched.

According to the third embodiment shown in FIG. 13(*c*), when the read instruction signal IN1 goes to "H" level, the NOR circuit 551 outputs "L" level to the node 540. The reason is that the level of the node 550 holds "H" level due to the DELAY 8 until the elapse of a given time after the read instruction signal IN1 changed to "H" level.

According to the fifth embodiment of the present invention, a signal, which changes from "H" level to "L" level at the leading edge of the read instruction signal IN1 from "L" level to "H" level, and holds "L" level until a given time elapses from the leading edge, is outputted to the node 540. Further, this signal and the column address latch signal are NANDed to produce a signal which is used as a control signal of the transfer gate.

Accordingly, since the node 540 holds "L" level for a given period although the column address latch signal changes to "H" level, the node 532 holds "H" level for a given period. Consequently, the column address /Y is not fetched because the PMOS 502 and the NMOS 503 constituting the transfer gate holds off state.

As mentioned above, according to the circuit diagram of the fifth embodiment of the present invention (FIGS. 13(*a*) to (*c*)), even if the control circuit CONT1 outputs the column address signal of "H" level due to the output reset noise, the latching of the column address latch signal is inhibited for a given period, thereby preventing the erroneous writing of data.

Particularly according to the fifth embodiment of the present invention (FIGS. 14(*a*) and (*c*)), since the fetching of the column address latch signal is inhibited from the early stage of the data write period, it is effective not only against the output reset noise but also the erroneous operation caused by the noise which is generated at the early stage of the data read operation.

INDUSTRIAL UTILIZATION

As mentioned above, the semiconductor device of the present invention is very effective to that which is liable to be largely varied in potential applied to the power supply VCC wire and GND wire.

What is claimed is:

1. A semiconductor device comprising:
   a control circuit which outputs a read instruction signal in response to a plurality of control signals;
   a driver comprising first and second output transistors and an output terminal;
   an enable signal generating circuit which outputs an enable signal having a pulse width greater than a pulse width of the read instruction signal, the enable signal generating circuit including,
   a delay circuit which delays the read instruction signal for a predetermined time period, and
   a logic circuit which produces the enable signal from the read instruction signal and an output of the delay circuit; and
   an output transistor control circuit which controls the first and second output transistors, respectively, the output transistor control circuit receiving a data signal and being enabled and disabled by the enable signal;
   wherein the delay circuit comprises an even number of inverters.

2. A semiconductor device as claimed in claim 1, wherein said delay circuit comprises an input coupled to an output of said control circuit, and wherein said logic circuit comprises a first input coupled to the output of said control circuit, a second input coupled to an output of said delay circuit, and an output which outputs the enable signal.

3. A semiconductor device as claimed in claim 2, wherein the logic circuit consists of a NAND gate which receives an inverted read instruction signal at the first input thereof, and wherein said delay circuit receives the inverted read instruction signal at the input thereof.

4. A semiconductor device as claimed in claim 1, wherein the logic circuit produces the enable signal based only on the read instruction signal and the output of the delay circuit.

5. A semiconductor device as claimed in claim 1, wherein the first and second output transistors are a PMOS transistor having a gate coupled for receiving the data signal, a source coupled to receive a first potential level and a drain connected to the output terminal, and an NMOS transistor having a gate coupled for receiving the data signal, a source coupled to receive a second potential level and a drain connected to the output terminal, respectively.

6. A semiconductor device as claimed in claim 5, wherein the source of the PMOS transistor is connected to a first potential source through a first parasitic reactance, and wherein the source of the NMOS transistor is connected to a second potential source through a second parasitic reactance.

7. A semiconductor device comprising:

a control circuit receiving a plurality of control signals and outputting in response thereto a read instruction signal;

a delay circuit receiving the read instruction signal and outputting in response thereto a delayed read instruction signal, said delay circuit having an even number of inverters;

a first NAND gate receiving the read instruction signal and the delayed read instruction signal, and outputting in response thereto a pulse-extended read instruction signal;

a second NAND gate receiving a data signal and the pulse-extended read instruction signal and outputting in response thereto, a first output transistor control signal;

a third NAND gate receiving an inverted data signal and the pulse-extended read instruction signal and outputting in response thereto, a second output transistor control signal; and a driver having first and second output transistors, receiving the first and the second output transistor control signals respectively, and each being connected to an output terminal.

8. A semiconductor device as claimed in claim 7, wherein the output terminal is connected to a reference voltage source through a resister and to ground through a capacitor.

9. A semiconductor device as claimed in claim 7, wherein the first NAND gate receives only the read instruction signal and the delayed read instruction signal.

10. A semiconductor device as claimed in claim 7, wherein the first and second output transistors are a PMOS transistor having a gate coupled for receiving the first output transistor control signal, a source coupled to receiving a first potential level and a drain connected to the output terminal, and an NMOS transistor having a gate coupled for receiving the second output transistor control signal, a source coupled to receive a second potential level and a drain connected to the output terminal, respectively.

11. A semiconductor device as claimed in claim 10, wherein the source of the PMOS transistor is connected to a first potential source through a first parasitic reactance, and wherein the source of the NMOS transistor is connected to a second potential source through a second parasitic reactance.

12. A semiconductor device as claimed in claim 7, wherein the output terminal is connected to a reference voltage source through a resister and to ground through a capacitor.

13. A semiconductor device comprising:

a control circuit generating a read instruction signal in response to a plurality of control signals;

an output terminal;

a driver connected to said output terminal, said driver including first and second output transistors;

an enable signal generating circuit connected to said control circuit for producing an enable signal in response to a read instruction signal, the enable signal having a pulse width greater than a pulse width of the read instruction signal, said enable signal generating circuit including a delay circuit having an even number of inverters; and a driver control circuit, connected to said enable signal generating circuit, for receiving a data signal and being enabled and disabled by the enable signal.

14. A semiconductor device as claimed in claim 13, wherein said enable signal generating circuit produces the enable signal based only on the read instruction signal.

15. A semiconductor device as claimed in claim 13, wherein the first and second output transistors are a PMOS transistor having a gate coupled for receiving the data signal, a source coupled to receive a first potential level and a drain connected to the output terminal, and an NMOS transistor having a gate coupled for receiving the data signal, a source coupled to receive a second potential level and a drain connected to the output terminal, respectively.

16. A semiconductor device as claimed in claim 15, wherein the source of the PMOS transistor is connected to a first potential source through a first parasitic reactance, and wherein the source of the NMOS transistor is connected to a second potential source through a second parasitic reactance.

17. A semiconductor device as claimed in claim 13, wherein the output terminal is connected to a reference voltage source through a resister and to ground through a capacitor.

18. A semiconductor device as claimed in claim 13, wherein said driver control circuit includes, a first NAND circuit having a first input terminal coupled to receive the data signal, a second input terminal coupled to receive the enable signal and an output terminal connected to the first output transistor, and a second NAND circuit having a first input terminal coupled to receive the data signal, a second input terminal coupled to receive the enable signal and an output terminal connected to the second output transistor.

19. A semiconductor device as claimed in claim 13, wherein said enable signal generating circuit including a delay circuit for delaying the read instruction signal and an NAND circuit having a first input terminal coupled for receiving the enable signal, a second terminal coupled for receiving a delayed instruction signal and an output terminal outputting the enable signal.

* * * * *